(12) United States Patent
Lim et al.

(10) Patent No.: US 11,803,081 B2
(45) Date of Patent: Oct. 31, 2023

(54) COLOR CONVERSION PLATE AND DISPLAY DEVICE

(71) Applicant: LG Display Co., Ltd., Seoul (KR)

(72) Inventors: KiSung Lim, Paju-si (KR); JaeHo Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/973,490

(22) Filed: Oct. 25, 2022

(65) Prior Publication Data

US 2023/0205001 A1   Jun. 29, 2023

(30) Foreign Application Priority Data

Dec. 28, 2021   (KR) .................. 10-2021-0189245

(51) Int. Cl.
| G02F 1/00 | (2006.01) |
| G02F 1/13357 | (2006.01) |
| G02F 1/1335 | (2006.01) |
| H01L 33/50 | (2010.01) |

(52) U.S. Cl.
CPC .. G02F 1/133603 (2013.01); G02F 1/133512 (2013.01); G02F 1/133514 (2013.01); G02F 1/133605 (2013.01); H01L 33/504 (2013.01); H01L 33/505 (2013.01)

(58) Field of Classification Search
CPC ............. H01L 33/504; H01L 33/505; G02F 1/133603; G02F 1/133605; G02F 1/133512; G02F 1/133514

See application file for complete search history.

(56) References Cited

U.S. PATENT DOCUMENTS

| 10,158,054 | B1 * | 12/2018 | Lin ........................ H01L 33/56 |
| 11,251,225 | B2 * | 2/2022 | Cha ...................... H01L 27/156 |
| 2012/0287381 | A1 | 11/2012 | Li et al. |
| 2014/0233212 | A1 * | 8/2014 | Park ................. G02F 1/133606 362/361 |
| 2015/0060905 | A1 * | 3/2015 | Nam ...................... H01L 33/60 257/89 |
| 2015/0131029 | A1 | 5/2015 | Kaida et al. |
| 2016/0116801 | A1 | 4/2016 | Fan et al. |
| 2016/0306101 | A1 * | 10/2016 | Lee ........................ H01L 33/60 |
| 2017/0343855 | A1 | 11/2017 | Han et al. |
| 2019/0121193 | A1 | 4/2019 | Ono |
| 2020/0089047 | A1 | 3/2020 | Baek et al. |
| 2022/0019012 | A1 * | 1/2022 | Li ........................ G02F 1/1336 |

OTHER PUBLICATIONS

European Patent Office, Extended European Search Report, European Patent Application No. 22206062.6, dated May 30, 2023, 11 pages.

* cited by examiner

Primary Examiner — Gerald J Sufleta, II
(74) Attorney, Agent, or Firm — Fenwick & West LLP

(57) ABSTRACT

A color conversion plate and a display device are disclosed. Since a color conversion plate including a color conversion area and a transmissive area separated by a reflection barrier rib is in the path where light is supplied to the color filter, efficiency and purity of light supplied to the color filter is enhanced and the color gamut of the light emitted to the outside of the display device through the color filter is also enhanced.

18 Claims, 9 Drawing Sheets

COLOR CONVERSION PLATE AND DISPLAY DEVICE

CROSS-REFERENCE TO RELATED APPLICATION

This application claims priority from Republic of Korea Patent Application No. 10-2021-0189245, filed on Dec. 28, 2021, which is hereby incorporated by reference in its entirety.

BACKGROUND

Field

Embodiments of the disclosure relate to a color conversion plate and a display device.

Description of Related Art

The display device may display an image corresponding to image data by controlling the brightness of light emitted by a plurality of subpixels disposed on the display panel.

Each of the plurality of subpixels may emit light of a specific wavelength band, and a color image may be displayed by a combination of light emitted from the plurality of subpixels.

To enhance the quality and color gamut of the image displayed through the display panel, it is required to enhance the efficiency of light emitted by each of the plurality of subpixels and to precisely control the wavelength of the light.

SUMMARY

Embodiments of the disclosure may provide a method for enhancing the light efficiency of a display panel and enhancing the color gamut of the image displayed through the display panel.

In one embodiment, a display device comprises: a display panel including a color filter layer; a backlight unit on the display panel, the backlight unit including a plurality of light sources configured to emit light of a first wavelength band; and a color conversion plate on a path along which the light emitted from the backlight unit is supplied to the display panel, wherein the color conversion plate includes: a plurality of color conversion areas each having a color conversion material configured to convert at least a portion of the light of the first wavelength band into light of a wavelength band that is different from the first wavelength band and transmit the converted light of the wavelength band that is different from the first wavelength band to the color filter; a plurality of transmissive areas configured to transmit the light of the first wavelength band to the color filter; and at least one reflection barrier rib that separates the plurality of color conversion areas and the plurality of transmissive areas from each other, the at least one reflection barrier rib configured to reflect incident light.

In one embodiment, a display device comprises: a substrate; a plurality of color conversion areas on the substrate, the plurality of color conversion areas including a color conversion material configured to convert at least a portion of light of a first wavelength band into light of a second wavelength band that is different from the first wavelength band; a plurality of transmissive areas on the substrate such that the plurality of transmissive areas are non-overlapping with the plurality of color conversion areas; at least one reflection barrier rib on the substrate, the at least one reflection barrier rib separating each of the plurality of color conversion areas and each of the plurality of transmissive areas from each other; a color filter layer including a plurality of color filters, each of the plurality of color filters overlapping a corresponding one of the plurality of color conversion areas or a corresponding one of the plurality of transmissive areas; and at least one black matrix that overlaps the at least one reflection barrier rib.

In one embodiment, a color conversion plate comprises: a transparent substrate; a plurality of first color conversion areas on the transparent substrate, the plurality of first color conversion areas including a first color conversion material configured to convert at least a first portion of light of a first wavelength band into light of a second wavelength band that is different from the first wavelength band; a plurality of second color conversion areas on the transparent substrate, the second plurality of color conversion areas including a second color conversion material configured to convert at least a second portion of the light of the first wavelength band into light of a third wavelength band that is different from the second wavelength band and the first wavelength band; and at least one reflection barrier rib that separates each of the plurality of first color conversion areas and each of the plurality of second color conversion areas from each other, wherein an upper surface of the at least one reflection barrier rib has a height that is higher than a height of an upper surface of the first color conversion material and a height of an upper surface of the second color conversion material, and wherein the height of the upper surface of the first color conversion material is between the height of the upper surface of the second color conversion material and the height of the upper surface of the at least one reflection barrier rib.

In one embodiment, a display device comprises: a display panel including a color filter; a backlight configured to emit light of a first wavelength band; and a color converter between the backlight and the display panel, the color converter configured to transmit a first portion of the light having the first wavelength band to the color filter, and convert a second portion of the light having the first wavelength into light having a wavelength band that is different from the first wavelength band, the first portion of the light having the first wavelength band and the light having the different wavelength band outputted by the color filter.

Effects of the Disclosure

According to embodiments of the disclosure, since a color conversion layer having a structure for separating wavelengths of light is positioned in a path through which light is supplied to the color filter, it is possible to increase the efficiency and purity of the light supplied to the color filter and enhance the color gamut of the display panel.

BRIEF DESCRIPTION OF THE DRAWINGS

The above and other objects, features, and advantages of the disclosure will be more clearly understood from the following detailed description, taken in conjunction with the accompanying drawings, in which.

DETAILED DESCRIPTION

Figure 1:
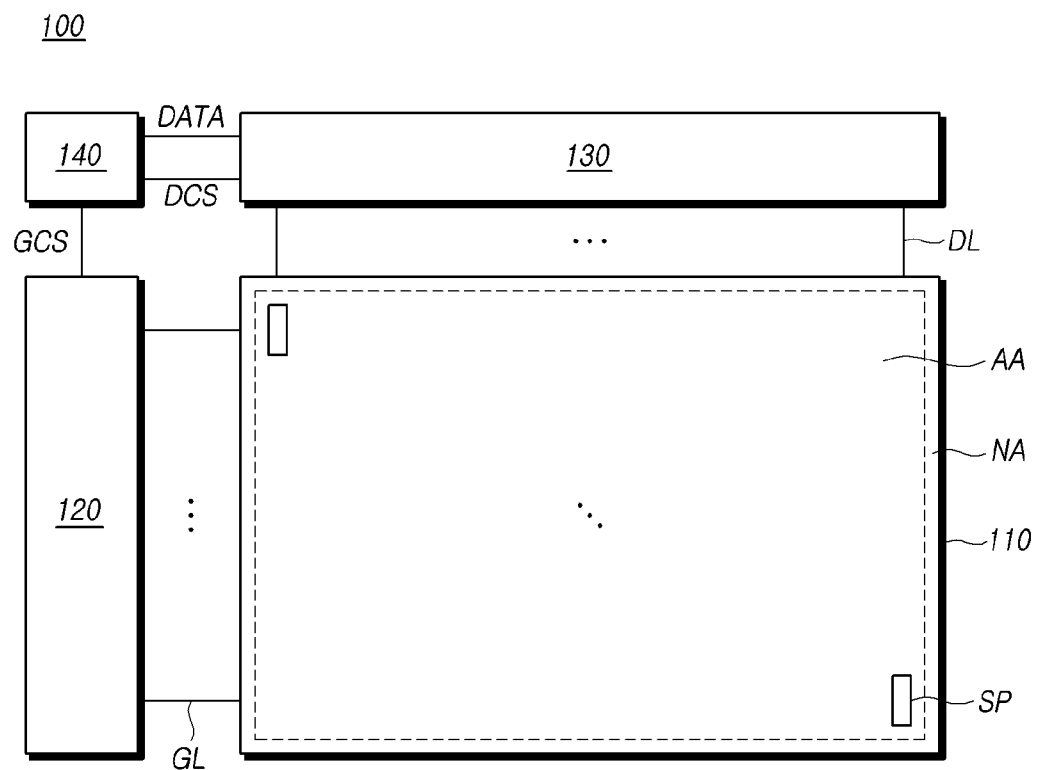
FIG. 1 is a view schematically illustrating a configuration of a display device according to various embodiments of the disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the disclosure will be described in detail with reference to accompanying drawings.

FIG. 1 is a view schematically illustrating a configuration of a display device 100 according to various embodiments of the disclosure.

Referring to FIG. 1, a display device 100 may include a display panel 110 and a gate driving circuit 120, a data driving circuit 130, and a controller 140 for driving the display panel 110.

The display panel 110 may include an active area AA in which a plurality of subpixels SP are disposed and a non-active area NA positioned outside the active area AA. A plurality of gate lines GL and a plurality of data lines DL may be disposed on the display panel 110. The plurality of subpixels SP may be positioned in areas where the gate lines GL and the data lines DL intersect.

The gate driving circuit 120 may be controlled by the controller 140. The gate driving circuit 120 sequentially outputs scan signals to a plurality of gate lines GL disposed on the display panel 110 and may control driving timings of the plurality of subpixels SP.

The gate driving circuit 120 may include one or more gate driver integrated circuits (GDIC). The gate driving circuit 120 may be located only on one side of the display panel 110 or on each of two opposite sides according to driving methods.

Each gate driver integrated circuit GDIC may be connected to a bonding pad of the display panel 110 using a tape automated bonding (TAB) method or a chip on glass (COG) method. Alternatively, each gate driver integrated circuit GDIC may be implemented in a gate in panel (GIP) type and be disposed directly on the display panel 110. Alternatively, each gate driver integrated circuit GDIC may be integrated and disposed on the display panel 110. Each gate driver integrated circuit (GDIC) may also be implemented in a chip-on-film (COF) scheme to be mounted on a film connected to the display panel 110.

The data driving circuit 130 may receive image data DATA from the timing controller 140 and convert the image data DATA into an analog data voltage. The data driving circuit 130 may output a data voltage to each data line DL according to the timing at which a scan signal is applied through the gate line GL and may control each subpixel SP to represent a brightness according to the image data.

The data driving circuit 130 may include one or more source driver integrated circuits (SDICs). Each source driver integrated circuit (SDIC) may include, e.g., shift registers, latch circuits, digital-analog converters, and output buffers.

Each source driver integrated circuit SDIC may be connected to a bonding pad of the display panel 110 using a tape automated bonding (TAB) method or a chip on glass (COG) method. Alternatively, each source driver integrated circuit SDIC may be directly disposed on the display panel 110. Alternatively, each source driver integrated circuit SDIC may be integrated and disposed on the display panel 110. Alternatively, each source driver integrated circuit SDIC may be implemented by a chip on film (COF) method. In this case, each source driver integrated circuit SDIC may be mounted on a film connected to the display panel 110 and may be electrically connected to the display panel 110 through lines on the film.

The controller 140 may supply various control signals to the gate driving circuit 120 and the data driving circuit 130 and control the driving of the gate driving circuit 120 and the data driving circuit 130.

The controller 140 may be mounted on a printed circuit board or a flexible printed circuit. The controller 140 may be electrically connected to the gate driving circuit 120 and the data driving circuit 130 through a printed circuit board or a flexible printed circuit.

The controller 140 may control the gate driving circuit 120 to output a scan signal according to the timing set in each frame. The controller 140 may convert the image data received from the outside (e.g., a host system) according to a data signal format used by the data driving circuit 130 and output the converted image data DATA to the data driving circuit 130.

The controller 140 may receive, from the outside (e.g., a host system), various timing signals including a vertical synchronization signal VSYNC, a horizontal synchronization signal HSYNC, an input data enable signal DE, and a clock signal, along with the image data DATA.

The controller 140 may generate a diversity of control signals using the timing signals received from the outside and output the control signals to the gate driving circuit 120 and the data driving circuit 130.

As an example, to control the gate driving circuit 120, the controller 140 may output various gate control signals GCS including a gate start pulse GSP, a gate shift clock GSC, and a gate output enable signal GOE.

The gate start pulse GSP may control the operation start timing of one or more gate driver integrated circuits GDICs constituting the gate driving circuit 120. The gate shift clock GSC is a clock signal commonly input to one or more gate driver integrated circuits GDICs and may control the shift timing of the scan signals. The gate output enable signal GOE may designate timing information about one or more gate driver integrated circuits GDICs.

To control the data driving circuit 130, the controller 140 may output various data control signals DCS including, e.g., a source start pulse SSP, a source sampling clock SSC, and a source output enable signal SOE, to the data driving circuit 130.

The source start pulse SSP may control the data sampling start timing of one or more source driver integrated circuits SDICs constituting the data driving circuit 130. The source sampling clock SSC may be a clock signal for controlling the sampling timing of data in each of one or more source driver integrated circuits SDIC. The source output enable signal SOE may control the output timing of the data driving circuit 130.

The display device 100 may further include a power management integrated circuit that supplies various voltages or currents to, the display panel 110 for example, the gate driving circuit 120, and the data driving circuit 130 or controls various voltages or currents to be supplied.

Each subpixel SP may be an area defined by the crossing of the gate line GL and the data line DL, and a liquid crystal layer or a light emitting element may be disposed in each subpixel SP depending on the type of the display device 100.

For example, if the display device 100 is an electroluminescent display device, a light emitting element and several elements for driving the light emitting element may be disposed in each of the plurality of subpixels SP. The light emitting element may be, e.g., an organic light emitting diode, an inorganic light emitting diode, and a quantum dot light emitting diode, but is not limited thereto. The display device 100 may control the driving current supplied to the light emitting element by the circuit element disposed in the subpixel SP and display an image corresponding to the image data.

As another example, when the display device 100 is a liquid crystal display device, the display panel 110 may include a liquid crystal layer.

The display panel 110 may include, for example, a substrate on which a circuit element for driving the liquid crystal layer is disposed and a substrate on which a color filter for realizing a color is disposed. The display device 100 may include a backlight unit that supplies light to the display panel 110 and may display the image corresponding to the image data by driving the liquid crystal layer and using the light supplied from the backlight unit.

The backlight unit may include, for example, an element for emitting light and various optical elements for enhancing the efficiency of light supplied to the display panel 110 and the wavelength range of the light.

Figure 2:
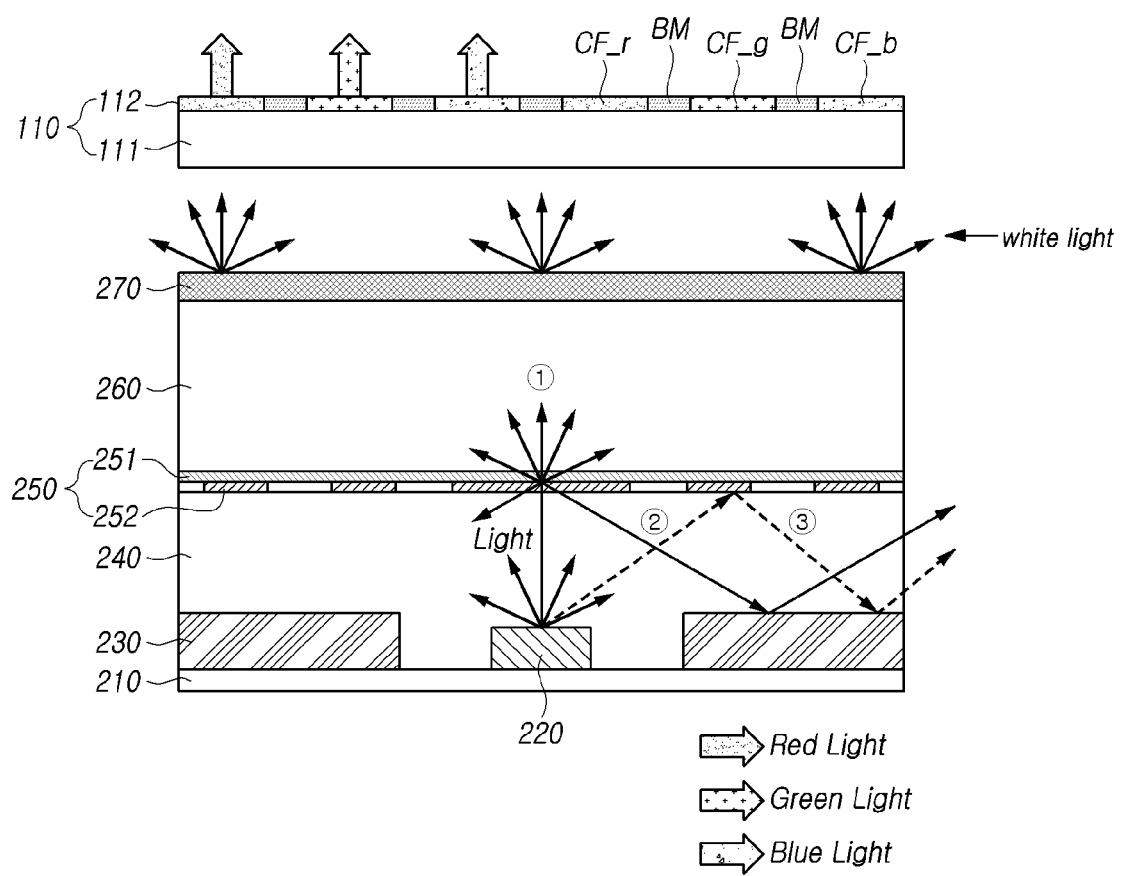
FIG. 2 is a cross-sectional view illustrating an example structure of a backlight unit according to embodiments of the disclosure.

FIG. 2 is a cross-sectional view illustrating an example structure of a backlight unit according to embodiments of the disclosure.

Referring to FIG. 2, the backlight unit may be positioned under the display panel 110 and may supply light to the display panel 110.

The backlight unit may include a plurality of light sources 220 to supply light to the display panel 110.

The light source 220 may be a light emitting diode such as an ultra-small mini light emitting diode or a micro light emitting diode, for example.

The light source 220 may be mounted on the circuit board 210. Although not shown in FIG. 2, the circuit board 210 on which the light source 220 is mounted and various optical elements may be received by the cover bottom.

The circuit board 210 may be a flexible printed circuit for example. Alternatively, the circuit board 210 may be a circuit board where signal lines or thin film transistors are disposed on a rigid substrate such as a glass substrate.

The light source 220 may emit light according to the signal supplied by the signal line disposed on the circuit board 210. The light source 220 may emit light in a white wavelength band or emit light in a specific wavelength band. For example, the light source 220 may emit light of a first wavelength band. In the disclosure, the light of the first wavelength band may mean blue light.

A reflector 230 may be disposed in at least a partial area of the area where the light source 220 is not disposed on the circuit board 210. As shown in FIG. 2, the reflector 230 is non-overlapping with the light source 220.

The reflector 230 may include a plurality of holes formed in an area corresponding to the position of the light source 220. The reflector 230 including a hole may be seated and disposed on the circuit board 210 on which the light source 220 is mounted.

The upper end (e.g., a top surface) of the reflector 230 may be positioned higher than the upper end (e.g., a top surface) of the light source 220, but is not limited thereto. Thus, the reflector 230 has a height that is greater than a height of the light source 220. In some cases, without the reflector 230, a material having a high reflectivity may be coated on the circuit board 210. Alternatively, a reflector 230 may be disposed on the circuit board 210, with a high-reflective material coated, increasing reflectivity in the entire area.

A light source protection portion 240 may be disposed on the light source 220 and the reflector 230.

The light source protection portion 240 may be formed of resin, but is not limited thereto.

The light source protection portion 240 may protect the light source 220 and may perform a function of guiding the light emitted from the light source 220.

Various optical sheets may be disposed on the light source protection portion 240.

For example, a light path control film 250 may be disposed on the light source protection portion 240.

The light path control film 250 may include a base film 251 and a plurality of light path control patterns 252 disposed on at least one of upper and lower surfaces of the base film 251.

The base film 251 may be a transparent film. The base film 251 may be formed of PET or the like, but is not limited thereto.

The plurality of light path control patterns 252 may be disposed on the lower surface of the base film 251. Each of the plurality of light path control patterns 252 may be positioned in an area corresponding to the area where each of the plurality of light sources 220 is disposed. Thus, at least one light control pattern 252 overlaps one light source 220.

The light path control pattern 252 may be disposed only in an area on the light source 220, for example. Alternatively, the light path control pattern 252 may be disposed on an area including the light source 220 and its surroundings.

The light path control pattern 252 may be disposed in a single shape or in a single layer and may be composed of multiple layers or multiple portions. When the light path control pattern 252 is composed of a plurality of layers or a plurality of portions, the material or thickness of the light path control pattern 252 may be varied so that the portion closest to the light source 220 has the highest light blocking performance and, farther away from the light source 220, the light blocking performance reduces.

The light path control pattern 252 may control the path of the light emitted from the light source 220. The light path control pattern 252 may be formed of a material, such as TiO2, and may have high light blocking performance, but is not limited thereto.

The light path control pattern 252 may transmit, reflect, or diffract at least a portion of the light emitted from the light source 220.

For example, the light path control pattern 252 may transmit a portion of the light emitted from the light source 220 (①).

Since the light path control pattern 252 is formed of a material having high light blocking performance, the amount of light passing through the light path control pattern 252 may be very small.

The light path control pattern 252 may reflect a portion of the light emitted from the light source 220 (②, ③).

The light reflected by the light path control pattern 252 may be reflected by the reflector 230 to the upper portion of the light source protection portion 240.

The light path control pattern 252 may be disposed in an area where the intensity of light emitted from the light source 220 is highest to reduce transmitted light and spread the light around the light source 220, so that the light may be uniformly supplied to the upper portion of the light source protection portion 240.

A diffusion plate 260 and various optical sheets may be disposed on the light path control film 250.

When the light source 220 emits light in the first wavelength band, a color conversion sheet 270 may be disposed on the diffusion plate 260.

The color conversion sheet 270 may convert at least a portion of the light of the first wavelength band into light of a second wavelength band that is different from the first wavelength band. For example, the color conversion sheet 270 may convert light of the first wavelength band (e.g., blue light) into light of a second wavelength band (e.g., green light) and light of a third wavelength band (e.g., red light).

The light of the first wavelength band emitted by the light source 220 and the light of the second wavelength band and the light of the third wavelength band converted into by the color conversion sheet 270 may be mixed into light of a white wavelength band that may then be supplied to the display panel 110.

The display panel 110 may include an array substrate 111 on which circuit elements for driving the liquid crystal layer are disposed and a color filter substrate 112 on which a plurality of color filters CF are disposed.

The color filter substrate 112 may include a red color filter CF_r, a green color filter CF_g, and a blue color filter CF_b. The color filter substrate 112 may include at least one black matrix BM that separates the color filters CF. The black matrix BM may prevent or at least reduce color mixing between adjacent subpixels SP.

The light of the white wavelength band supplied from the backlight unit to the display panel 110 may pass through the color filters CF, so that red, green, and blue light may be emitted outside of the display panel 110.

Embodiments of the disclosure may increase the efficiency and purity of the light supplied to the color filters CF and enhance the color gamut of the light emitted through the color filters CF by the color conversion layer structured to separate wavelengths of light in the path through which light is supplied to the color filters CF.

Figure 3:
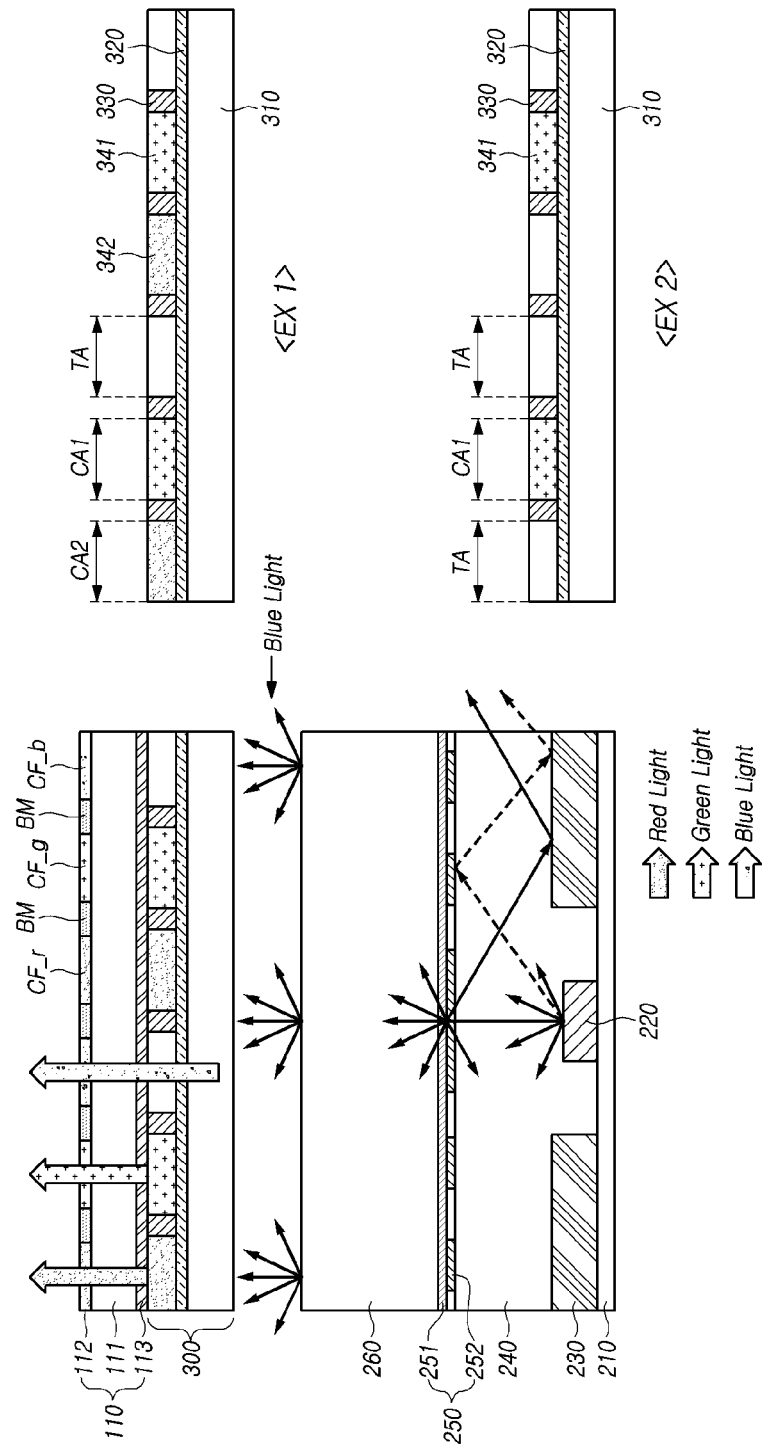
FIG. 3 is a cross-sectional view illustrating an example structure in which a display device includes a color conversion plate according to embodiments of the disclosure.

FIG. 3 is a cross-sectional view illustrating an example structure in which a display device 100 includes a color conversion plate 300 according to embodiments of the disclosure. In one embodiment, the color conversion plate 300 may be referred to as a color converter.

Referring to FIG. 3, the color conversion plate 300 may be positioned in the path through which light is supplied from the backlight unit to the display panel 110. Thus, the color conversion plate 300 is between the backlight unit and the display panel 1110.

The color conversion plate 300 may be bonded to the display panel 110, for example. The color conversion plate 300 may be bonded to the polarizing plate 113 disposed on the lower surface of the display panel 110.

The color conversion plate 300 may include a transparent substrate 310, a plurality of color conversion areas CA and a plurality of transmissive areas TA disposed on the transparent substrate 310. The color conversion plate 300 may include at least one reflection barrier rib 330 (e.g., a reflective barrier) that separates the plurality of color conversion areas CA and the plurality of transmissive areas TA from each other. That is, the reflective barrier rib 330 separates each of the plurality of color conversion areas from each other and separates each of the plurality of transmissive areas from each other and from the plurality of color conversion areas. The color conversion plate 300 may include a reflection layer 320 disposed on the transparent substrate 310.

A color conversion material may be disposed in each of the plurality of color conversion areas CA. The color conversion material may convert at least a portion of the light of the first wavelength band into light of a wavelength band other than the first wavelength band. The color conversion material may a phosphor, but is not limited thereto.

The plurality of transmissive areas TA may be areas without color conversion material. The transmissive area TA may be a transparent area. That is, the transmissive area TA includes a material that does not convert light of the first wavelength band into another wavelength band.

The color conversion plate 300 may separate the wavelength band of light supplied from the backlight unit and supply it to the display panel 110.

For example, light (e.g., blue light) of the first wavelength band may be supplied from the backlight unit to the color conversion plate 300.

The plurality of color conversion areas CA may include a plurality of first color conversion areas CA1 having a first color conversion material 341 for converting at least a portion of the light of the first wavelength band into light of a second wavelength band (e.g., green light). The plurality of color conversion areas CA may include a plurality of second color conversion areas CA2 having a second color conversion material 342 for converting at least a portion of the light of the first wavelength band into light of a third wavelength band (e.g., red light).

The light of the second wavelength band may be supplied to the display panel 110 through the first color conversion area CA1 The light of the third wavelength band may be supplied to the display panel 110 through the second color conversion area CA2.

Since the transmissive area TA is an area with no color conversion material, the light of the first wavelength band supplied from the backlight unit may be transmitted through the transmissive area TA to the display panel 110.

The reflection barrier rib 330 may reflect the light supplied from the backlight unit and the light converted by the color conversion material.

The reflection barrier rib 330 may be a white resin in one embodiment. The reflection barrier rib 330 may be disposed using photo imageable solder resist (PSR), but is not limited thereto. The reflection barrier rib 330 may be formed of any material having light reflectability.

Since the reflection barrier rib 330 is positioned between the plurality of color conversion areas CA and the plurality of transmissive areas TA, the light transmitted through the color conversion area CA and the transmissive area TA may be separated into the light of the second wavelength band and the light of the third wavelength band that may then be supplied to the display panel 110.

Each of the plurality of color conversion areas CA and the plurality of transmissive areas TA may be disposed to correspond to the color filter CF disposed on the display panel 110.

For example, the first color conversion area CA1 may be positioned to overlap the green color filter CF_g. The second color conversion area CA2 may be positioned to overlap the red color filter CF_r. The transmissive area TA may be positioned to overlap the blue color filter CF_b.

Since the light separated into the first wavelength band, second wavelength band, and third wavelength band by the color conversion plate 300 is supplied to corresponding color filters CF among the plurality of color filters CF, the purity of the light supplied to the color filters CF may be increased. Further, the efficiency of light emitted through the color filter CF may be increased.

The structure in which the plurality of color conversion areas CA and the plurality of transmissive areas CA are disposed and the color conversion material disposed in the plurality of color conversion areas CA may vary depending on the light supplied from the backlight unit.

For example, when the light source 220 included in the backlight unit emits blue light, the color conversion plate 300 may have the same structure as in <EX 1>.

The color conversion plate 300 may include a first color conversion area CA1 in which the first color conversion material 341 is disposed and a second color conversion area CA2 in which the second color conversion material 342 is disposed. The color conversion plate 300 may include a transmissive area TA that transmits blue light as it is.

Blue light may be converted in the first color conversion area CA1 and the second color conversion area CA2 and be transmitted through the transmissive area TA so that red light, green light, and blue light may be supplied to the display panel 110.

As another example, when the light source 220 included in the backlight unit emits magenta light, the color conversion plate 300 may have the structure as in <EX 2>.

The color conversion plate 300 may include the first color conversion area CA1 in which the first color conversion material 341 is disposed. The color conversion plate 300 may include at least two transmissive areas TA positioned between the two first color conversion areas CA1.

Magenta light may be transmitted through the first color conversion area CA1 to the display panel 110. Green light may be supplied to the color filter CF of the display panel 110 positioned corresponding to the first color conversion area CAL Magenta light may be transmitted through the transmissive area TA to the red color filter CF_r and the blue color filter CF_b of the display panel 110. The magenta light may be transmitted through the red color filter CF_r and the blue color filter CF_b, so that the red light and the blue light may be emitted to the outside of the display panel 110.

When magenta light is supplied from the backlight unit, the color conversion material disposed in the color conversion plate 300 may be reduced.

Even in this case, since the transmissive area TA corresponding to the red color filter CF_r and the transmissive area TA corresponding to the blue color filter CF_b are separated by the reflection barrier rib 330, the wavelengths of the light emitted through the red color filter CF_r and the blue color filter CF_b may be more clearly distinguished. Alternatively, in some cases, a reflection barrier rib 330 may be disposed between the color conversion area CA and the transmissive area TA while no reflection barrier rib 330 is disposed between the transmissive areas TA.

As such, the structure of the color conversion area CA included in the color conversion plate 300 may be varied depending on the type of the light source 220.

Since the light passing through the color conversion area CA and the transmissive area TA is supplied to the corresponding color filter CF, efficiency and purity of light emitted through the color filter CF may be enhanced.

Figure 4:
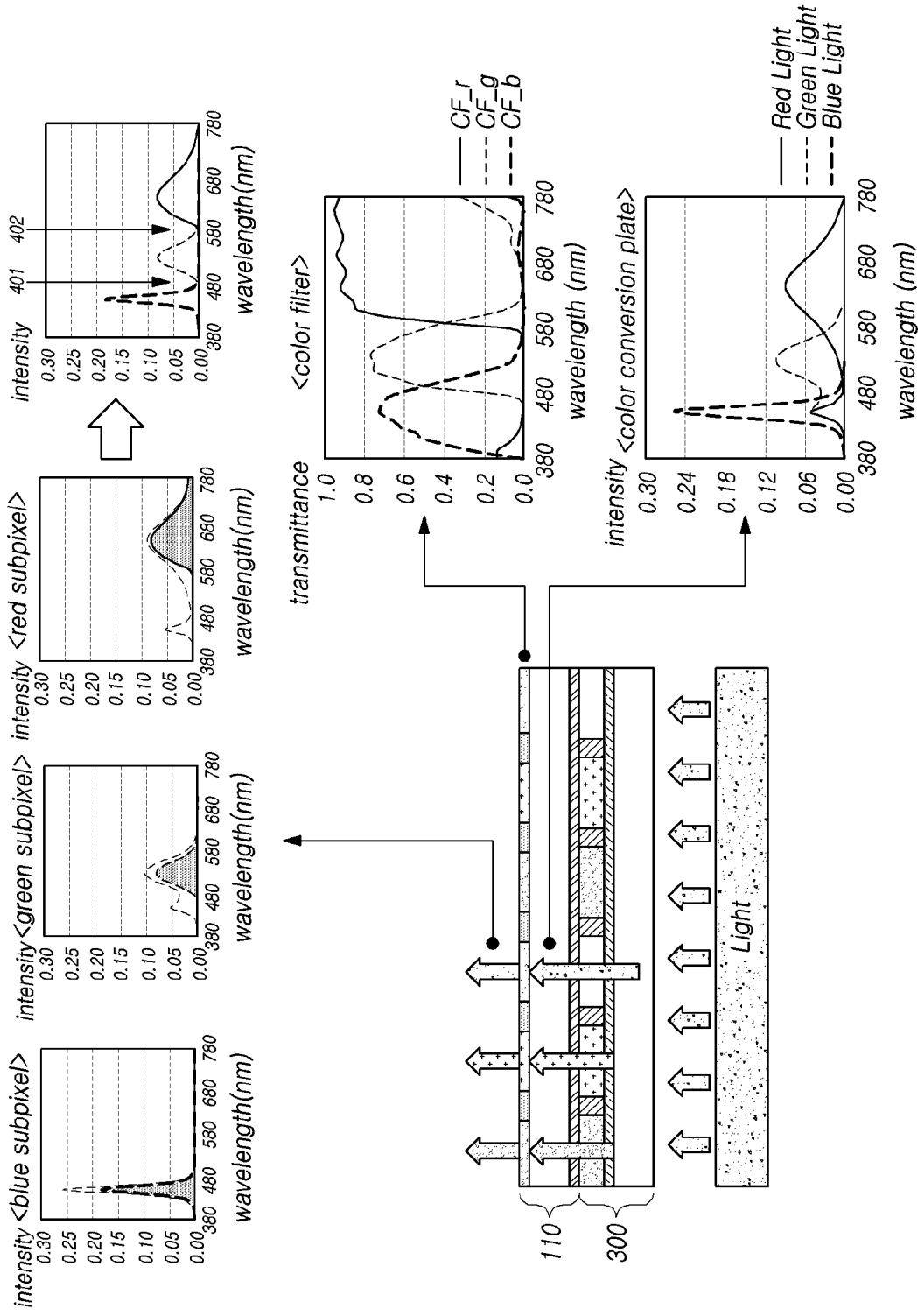
FIG. 4 is a view illustrating an example of a wavelength of light emitted to the outside of a display device by a color conversion plate according to embodiments of the disclosure.
Figure 5:
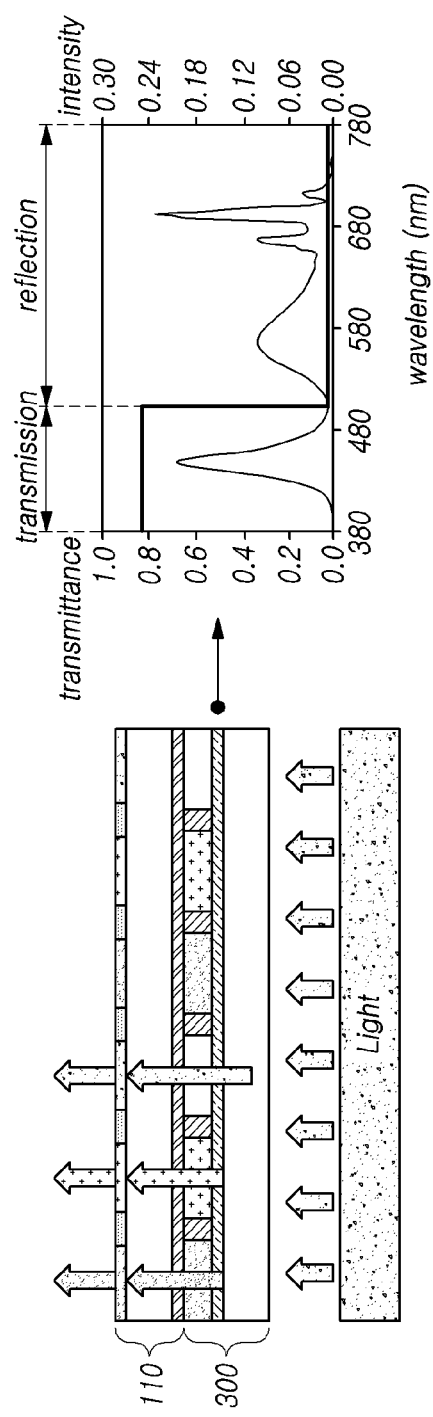
FIG. 5 is a view illustrating an example of a wavelength of light reflected by a reflection layer included in a color conversion plate according to embodiments of the disclosure.

FIG. 4 is a view illustrating an example of a wavelength of light emitted to the outside of a display device 100 by a color conversion plate 300 according to embodiments of the disclosure. FIG. 5 is a view illustrating an example of a wavelength of light reflected by a reflection layer 320 included in a color conversion plate 300 according to embodiments of the disclosure.

FIG. 4 illustrates an example in which the backlight unit supplies blue light.

Blue light supplied from the backlight unit may be transmitted through the color conversion plate 300 while being separated into red light, green light and blue light.

The red light, green light, and blue light passing through the color conversion plate 300 may be supplied to the red color filter CF_r, the green color filter CF_g, and the blue color filter CF_b, respectively, disposed on the display panel 110.

The light of each wavelength band filtered by the red color filter CF_r, the green color filter CF_g, and the blue color filter CF_b may be emitted to outside of the display panel 110.

As the light of wavelength bands separated into while passing through the color conversion plate 300 is emitted through their corresponding color filters CF, the efficiency of the light emitted to the outside of the display panel 110 may be enhanced.

For example, since blue light passing through the transmissive area TA of the color conversion plate 300 passes through the blue color filter CF_b, the ratio of the light blocked by the blue color filter CF_b to the light supplied to the blue color filter CF_b may be small. Further, the efficiency of light emitted through the blue color filter CF_b may be enhanced.

Since the red light transmitted through the color conversion area CA of the color conversion plate 300 passes through the red color filter CF_r, the efficiency of the light emitted through the red color filter CF_r may be enhanced. Since the green light transmitted through the color conversion area CA of the color conversion plate 300 passes through the green color filter CF_g, the efficiency of the light emitted through the green color filter CF_g may be enhanced.

Since the efficiency of the light emitted to the outside of the display panel 110 is enhanced, the luminance of the image displayed through the display panel 110 may be enhanced. It is also possible to reduce the power consumption of the backlight unit while displaying images having the same luminance through the display panel 110.

Further, since the light of wavelength bands separated reaches the color filters CF and is emitted to the outside, color mixing between the light emitted through the color filters CF may be prevented or reduced.

As indicated by 401 of FIG. 4, the light of a wavelength band positioned at the boundary between blue light and green light may not be emitted to the outside of the display panel 110. As indicated by 402 of FIG. 4, the light of a wavelength band positioned at the boundary between green light and red light may not be emitted to the outside of the display panel 110.

Color mixing between light emitted to the outside through each subpixel SP of the display panel 110 may be reduced. The color gamut of the image displayed through the display panel 110 may be enhanced.

The light efficiency obtained by the color conversion plate 300 may further be enhanced by disposing the reflection layer 320 under the color conversion material disposed in the color conversion plate 300.

Referring to FIG. 5, the color conversion plate 300 may include a reflection layer 320 disposed on the transparent substrate 310.

The reflection layer 320 may be disposed between the transparent substrate 310 and the color conversion material.

The reflection layer 320 may be disposed in the transmissive area TA on the transparent substrate 310. Further, the reflection layer 320 may be disposed between the transparent substrate 310 and the reflection barrier rib 330.

The reflection layer 320 may be a film in which two types of refractive index materials are stacked in multiple layers, such as a dichroic film. Alternatively, the reflection layer 320 may be a distributed Bragg reflector (DBR). The reflection layer 320 is not limited to the above-described example, and may be formed of a material or structure capable of reflecting light of a specific wavelength band.

The reflection layer 320 may reflect at least a portion of light of a wavelength band other than the first wavelength band.

The reflection layer 320 may reflect green light and red light when the backlight unit supplies blue light. The reflection layer 320 may transmit blue light and reflect green light and red light.

Since the red light and the green light are reflected by the reflection layer 320, the light reflected or scattered to the backlight unit among the light converted into the red light and the green light in the color conversion area CA may be reflected by the reflection layer 320.

The amount of red light and green light converted into in the color conversion area CA by the reflection layer 320 and the reflection barrier rib 330 and supplied to the display panel 110 may be increased.

Since the transmissive area TA is an area surrounded by the reflection barrier rib 330 and is free from the color conversion material and has an air layer positioned, the blue light may be diffused by the air layer, so that the efficiency of the light supplied to the display panel 110 may be increased.

As such, the efficiency of light supplied to each subpixel SP of the display panel 110 may be enhanced by the color conversion plate 300.

Further, it is possible to enhance light diffusion efficiency by allowing an air layer to be positioned in each color conversion area CA.

Figure 6:
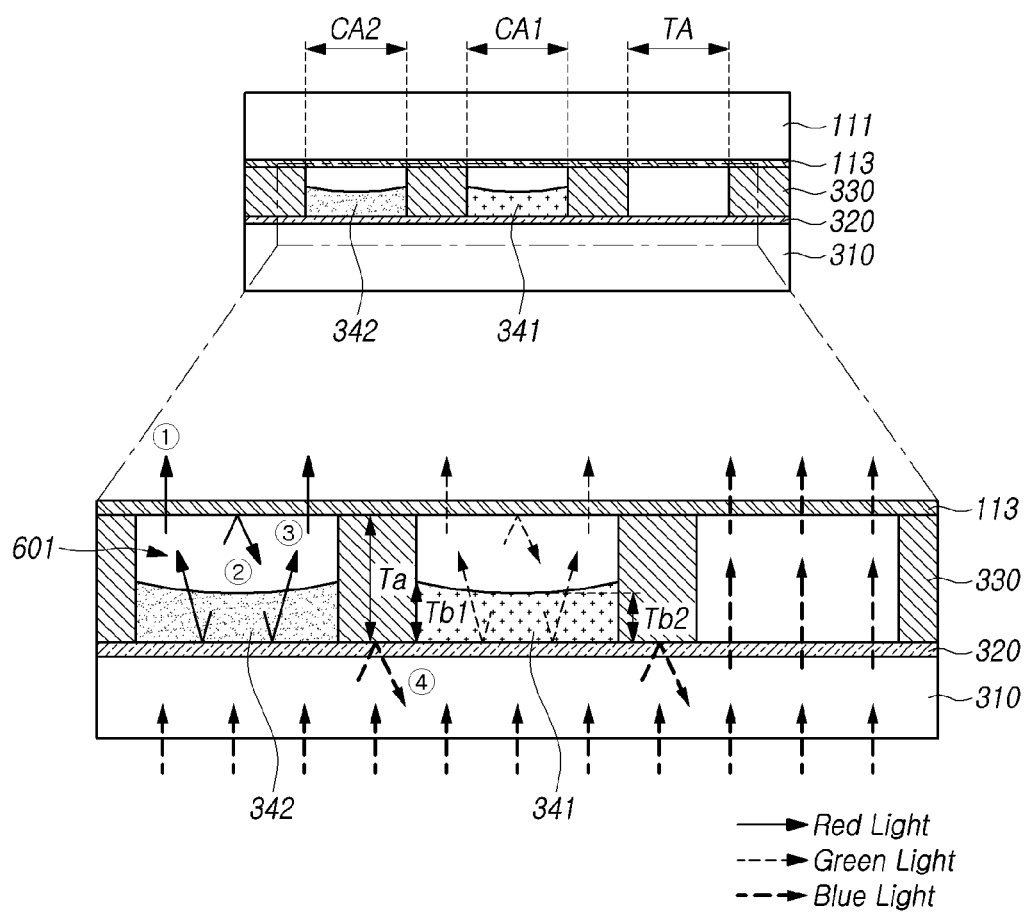
FIG. 6 is a view illustrating an example structure in which a color conversion material is disposed in a color conversion area of a color conversion plate according to embodiments of the disclosure.
Figure 7:
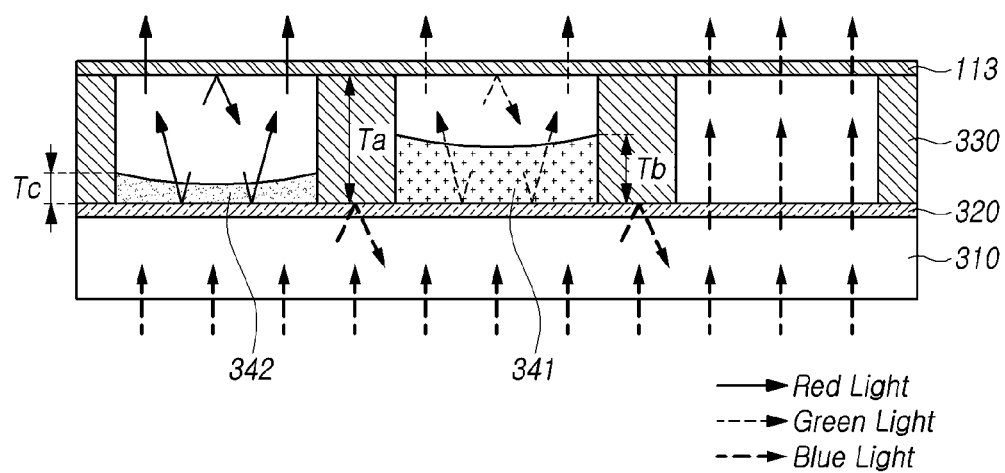
FIG. 7 is a view illustrating another example structure in which a color conversion material is disposed in a color conversion area of a color conversion plate according to embodiments of the disclosure.

FIG. 6 is a view illustrating an example structure in which a color conversion material is disposed in a color conversion area CA of a color conversion plate 300 according to embodiments of the disclosure. FIG. 7 is a view illustrating another example structure in which a color conversion material is disposed in a color conversion area CA of a color conversion plate 300 according to embodiments of the disclosure.

Referring to FIG. 6, the color conversion plate 300 may include a transparent substrate 310 and a reflection layer 320 disposed on the transparent substrate 310.

A first color conversion area CA1, a second color conversion area CA2, and a transmissive area TA may be positioned on the reflection layer 320. A reflection barrier rib 330 may be disposed on the reflection layer 320. The reflection barrier rib 330 may separate the first color conversion area CA1, the second color conversion area CA2, and the transmissive area TA.

A first color conversion material 341 that converts light of a first wavelength band into light of a second wavelength band may be disposed in the first color conversion area CAL A second color conversion material 342 that converts light of the first wavelength band into light of a third wavelength band may be disposed in the second color conversion area CA2.

The upper surface of the first color conversion material 341 and the upper surface of the second color conversion material 342 may be positioned lower than the upper surface of the reflection barrier rib 330. The thickness Tb1 of the first color conversion material 341 and the thicknesses Tb2 of the second color conversion material 342 may be less (e.g., thinner) than the thickness Ta of the reflection barrier rib 330.

For example, the upper surface of the reflection barrier rib 330 may be attached (e.g., adhered) to the polarizing plate 113 positioned under the display panel 110. The color conversion material and the polarizing plate 113 may be spaced apart from each other. An air layer 601 may be positioned between the color conversion material and the polarizing plate 113.

The upper surface of the color conversion material may have a concave shape in a direction towards the backlight unit. The thickness of a portion of the color conversion material in contact with the reflection barrier rib 330 may be thicker than the thickness of the remaining portion that is not in contact with the reflection barrier rib 330 (e.g., a central portion).

For example, the thickness Tb1 of a portion of the color conversion material in contact with the reflection barrier rib 330 may be larger than the thickness Tb2 of a central portion of the color conversion material.

In the process of disposing the color conversion material so that the air layer is positioned in each color conversion area CA, the upper surface of the color conversion material may be rendered concave due to surface tension.

Since the air layer 601 is positioned on the concave upper surface of the color conversion material disposed in the color conversion area CA, the diffusability of light passing through the color conversion area CA may be enhanced.

For example, the light of the first wavelength band supplied to the color conversion area CA may be converted in wavelength band and be emitted upward from the color conversion plate 300 as shown in ①. A portion of the light converted in the color conversion area CA may be reflected by the polarizing plate 113 as shown in ②. The light reflected by the polarizing plate 113 may be reflected again by the reflection layer 320 as shown in ③ and be supplied upward from the color conversion plate 300.

Since an air layer 601 having a low refractive index is positioned on the color conversion material, the light converted into by the color conversion material may be diffused by the air layer. A portion of the diffused light may be emitted upward from the color conversion plate 300, and another portion of the diffused light may be reflected by the reflection layer 320 and the reflection barrier rib 330 and be emitted upward from the color conversion plate 300.

A portion of the light emitted from the backlight unit and directed to the color conversion area CA may be reflected by the reflection barrier rib 330 as shown in ④.

The light of the first wavelength band may be blocked in the color conversion area CA, and the light of the second wavelength band and the light of the third wavelength band emitted from the color conversion area CA may increase.

The amount and purity of the light in each wavelength band supplied to the display panel 110 may be enhanced.

The amount of the color conversion material disposed in each color conversion area CA of the color conversion plate 300 may differ depending on the type of the color conversion material.

For example, referring to FIG. 7, the amount of the first color conversion material 341 disposed may be greater than the amount of the second color conversion material 342 disposed.

Since the air layer is positioned on the color conversion material disposed in the color conversion area CA, the thickness Tb of the first color conversion material 341 and the thickness Tc of the second color conversion material 342 may be less than the thickness Ta of the reflection barrier ribs 330.

Since the color converting material is disposed such that an air layer is positioned on the color converting material, the upper surface of the color converting material may have a concave shape.

Since the amount of the first color conversion material 341 is greater than the amount of the second color conversion material 342, the thickness Tb of the first color conversion material 341 may be thicker (e.g., larger) than the thickness Ta of the second color conversion material 342.

The upper surface of the first color conversion material 341 may be positioned between the upper surface of the second color conversion material 342 and the upper surface of the reflection barrier rib 330. That is, an upper surface of the reflection barrier rib 330 has a height that is higher than a height of an upper surface of the first color conversion material 341 and a height of an upper surface of the second color conversion material 342, and the height of the upper surface of the first color conversion material 341 is between the height of the upper surface of the second color conversion material 342 and the height of the upper surface of the reflection barrier rib 330.

The upper surface of the reflection barrier rib 330 may be adhered to the polarizing plate 113, and the upper surface of the color conversion material may be spaced apart from the polarizing plate 113.

The thickness of the air layer on the second color conversion material 342 may be larger than the thickness of the air layer on the first color conversion material 341.

It is possible to allow the light having the same or similar color coordinates to those required for the light supplied to the display panel 110 to be emitted through the color conversion plate 300 by varying the amount of the color conversion material disposed in the color conversion area CA.

It is possible to implement accurate color coordinates by increasing the amount of the color conversion material for converting the light of the wavelength band required for the color coordinates. Since the amount of the other color conversion materials is relatively reduced, the air layer in the color conversion area CA may be increased to enhance light diffusion performance.

It is possible to enhance the efficiency and purity of the light supplied to the display panel 110 by adjusting the amount of the air layer and the amount of the color conversion material and the presence or absence of the color conversion material in the color conversion area CA and the transmissive area TA of the color conversion plate 300. It is possible to enhance the color gamut of the light emitted through the display panel 110.

The color conversion plate 300 may be bonded to the display panel 110. Each area of the color conversion plate 300 may be positioned corresponding to the color filter CF disposed on the display panel 110.

Figure 8:
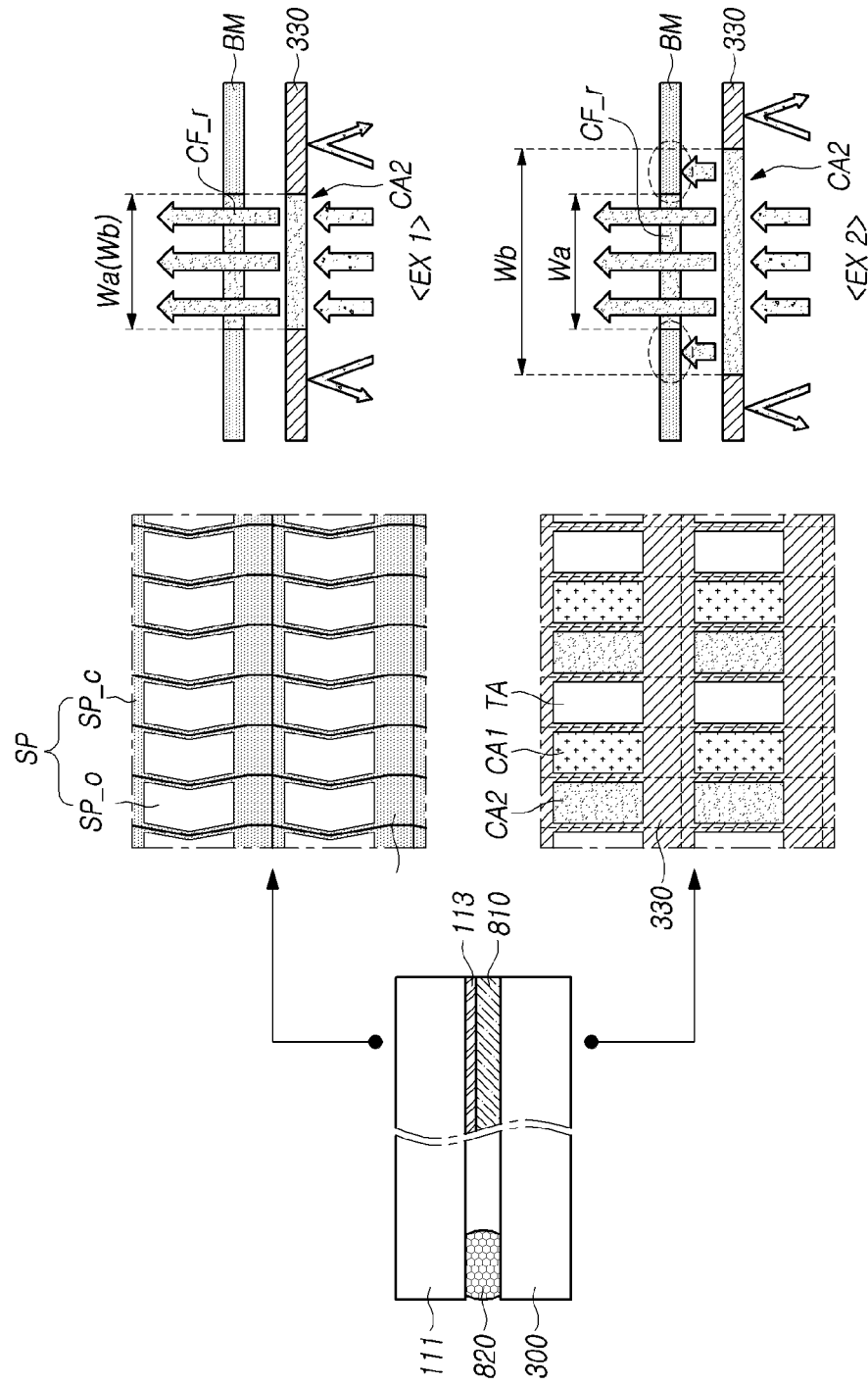
FIG. 8 is a view illustrating an example in which a color conversion plate and a display panel are bonded together according to embodiments of the disclosure.

FIG. 8 is a view illustrating an example in which a color conversion plate 300 and a display panel 110 are bonded together according to embodiments of the disclosure.

Referring to FIG. 8, the color conversion plate 300 may be adhered to the polarizing plate 113 positioned on the lower surface of the array substrate 110 of the display panel 110 by an adhesive layer 810. The color conversion plate 300 may be bonded to the array substrate 111 of the display panel 110 by a sealant 820 in the periphery area.

The subpixel SP disposed on the display panel 110 may include an opening portion SP_o through which light is emitted to the outside and a non-opening portion SP_c that is an area other than the opening portion SP_o.

The first color conversion area CA1, the second color conversion area CA2, and the transmissive area TA of the color conversion plate 300 may be positioned corresponding to the opening portion SP_o of the subpixel SP disposed on the display panel 110. That is, the first color conversion area CA1, the second color conversion area CA2, and the transmissive area TA of the color conversion plate 300 respectively overlap a corresponding opening portion SP_o.

The reflection barrier rib 330 of the color conversion plate 300 may be positioned corresponding (e.g., overlapping) to the non-opening portion SP_c disposed on the display panel 110.

The sizes of the color conversion area CA and the transmissive area TA of the color conversion plate 300 may be equal to or larger than the size of the opening portion SP_o of the display panel 110.

The second color conversion area CA2 is described as an example. As in the example shown in <EX 1>, the width Wb of the second color conversion area CA2 may be equal to the width Wa of the red color filter CF_r. The width of the red color filter CF_r may mean a width corresponding to the size of the opening portion SP_o of the subpixel SP.

The width of the reflection barrier rib 330 may correspond to the width of the black matrix BM.

Since the size of the second color conversion area CA2 is the same as that of the red color filter CF_r, loss of light supplied from the second color conversion area CA2 to the red color filter CF_r may be minimized.

As another example, as in the example shown in <EX 2>, the width Wb of the second color conversion area CA2 may be greater than the width Wa of the red color filter CF_r.

A portion of the second color conversion area CA2 may overlap the black matrix BM. The width of the reflection barrier rib 330 may be less than (e.g., smaller) the width of the black matrix BM.

Since the width of the second color conversion area CA2 is wider than the width of the red color filter CF_r, alignment between the color conversion area CA and transmissive area TA of the color conversion plate 300 and the opening portion SP_o of the display panel 110 may be facilitated during the process of bonding the color conversion plate 300 and the display panel 110.

Figure 9:
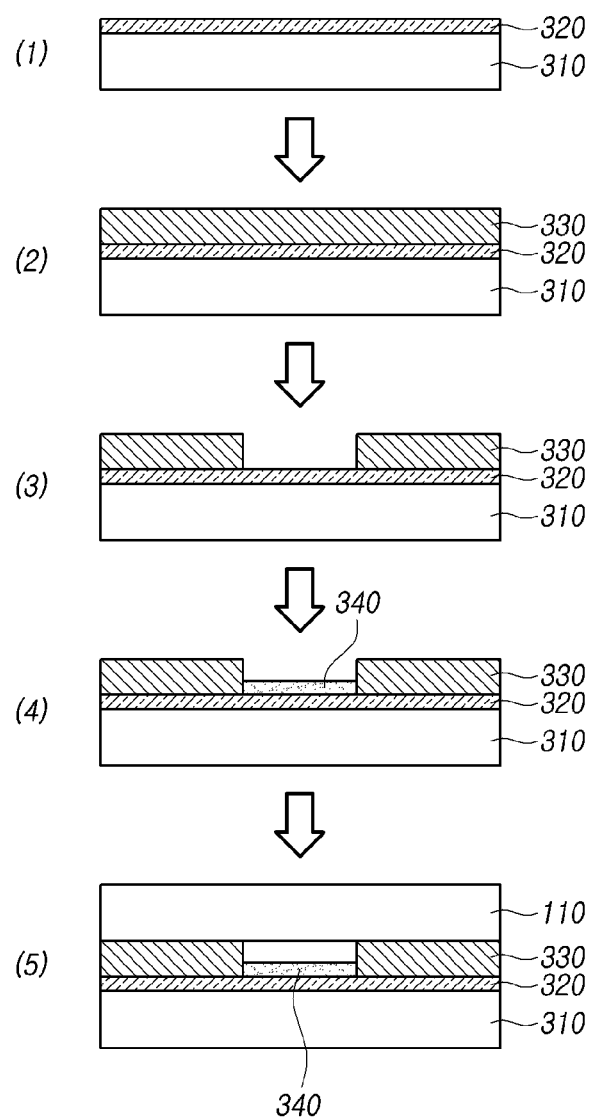
FIG. 9 is a view illustrating an example method for manufacturing a color conversion plate according to embodiments of the disclosure.

FIG. 9 is a view illustrating an example method for manufacturing a color conversion plate 300 according to embodiments of the disclosure.

Referring to FIG. 9, as in step (1), a reflection layer 320 may be disposed on a transparent substrate 310. As in the above-described example, the reflection layer 320 may be formed of a film that reflects light (e.g., red light and green light) of a specific wavelength band, such as a dichroic film.

As in step (2), e.g., a PSR dry film photo-resist (DFR) may be disposed to form a reflection barrier rib 330 on the reflection layer 320. The PSR DFR may be disposed on the reflection layer 320 and cured.

As in step (3), a portion of the PSR may be removed. For example, a portion of the PSR may be removed by a process using a laser. As the PSR is removed, a reflection barrier rib 330 may be formed. The area where the PSR has been removed may become a color conversion area CA or a transmissive area TA.

As in step (4), a color conversion material 340 may be disposed in a portion of the PSR-removed area. The color conversion material 340 may be disposed by, e.g., inkjet printing after plasma treatment on the surface of the reflection layer 320. Thereafter, the color conversion material 340 may be cured by a curing process using UV.

An upper surface of the color conversion material 340 may be positioned lower than an upper surface of the reflection barrier rib 330. The upper surface of the color conversion material 340 may have a concave shape.

As in step (5), the display panel 110 may be bonded onto the color conversion plate 300. The reflection barrier rib 330 may be adhered to the display panel 110. An air layer may be positioned on the color conversion material 340.

The color conversion plate 300 that enhances the light efficiency and color gamut of the display panel 110 may be easily bonded to the display panel 110 by the above-described process.

Although the above-described example is directed to a liquid crystal display device, the structure of the color conversion plate 300 according to embodiments of the disclosure may be applied to other various types of display devices.

As an example, in the case of the display device 100 in which light emitting elements are disposed on the display panel 110, a structure corresponding to the color conversion plate 300 may be disposed between the area where light is emitted from the light emitting element and the area where the color filters CF are disposed.

It is possible to increase the efficiency and purity of the light supplied to the color filter CF and enhance the color gamut of the light emitted to the outside through the color filter CF, by the color conversion plate 300.

The foregoing embodiments are briefly described below.

A display device 100 according to embodiments of the disclosure may comprise a display panel 110 including a color filter layer 112, a backlight unit positioned outside the display panel 110 and including a plurality of light sources 220 emitting light of a first wavelength band, and a color conversion plate 300 positioned on a path along which light emitted from the backlight unit is supplied to the display panel 110.

The color conversion plate 300 may include a plurality of color conversion areas CA having a color conversion material converting at least a portion of the light of the first wavelength band into light of a wavelength band other than the first wavelength band, a plurality of transmissive areas TA transmitting the light of the first wavelength band, and at least one reflection barrier rib 330 disposed to separate the plurality of color conversion areas CA and the plurality of transmissive areas TA and reflecting incident light.

A thickness of the color conversion material may be smaller than a thickness of the at least one reflection barrier rib 330.

A thickness of a portion of the color conversion material, in contact with the at least one reflection barrier rib 330, may be larger than a thickness of a remaining portion.

An upper surface of the color conversion material may be concave.

An upper surface of the at least one reflection barrier rib 330 may be adhered to the display panel 110, and an upper surface of the color conversion material is spaced apart from the display panel 110.

An air layer may be positioned on the color conversion material.

The plurality of color conversion areas CA may include a plurality of first color conversion areas CA1 having a first color conversion material 341 converting at least a portion of the light of the first wavelength band into light of a second wavelength band and a plurality of second color conversion areas CA2 having a second color conversion material 342 converting at least a portion of the light of the first wavelength band into light of a third wavelength band.

A thickness of the first color conversion material 341 may differ from a thickness of the second color conversion material 342.

The second wavelength band may be smaller than the third wavelength band, and the thickness of the first color conversion material 341 may be larger than the thickness of the second color conversion material 342.

The color filter layer 112 may include a plurality of color filters CF and at least one black matrix BM disposed between the plurality of color filters CF.

The at least one reflection barrier rib 330 may be disposed in an area corresponding to an area where the at least one black matrix BM is disposed.

Each of the plurality of color conversion areas CA and the plurality of transmissive areas TA may correspond to each of the plurality of color filters CF, and a width of each of the plurality of color conversion areas CA and the plurality of transmissive areas TA may be equal to or larger than a width of each of the plurality of color filters CF.

A portion of each of the plurality of color conversion areas CA and the plurality of transmissive areas TA may overlap the at least one black matrix BM.

A width of the at least one reflection barrier rib 330 may be smaller than a width of the at least one black matrix BM.

The color conversion plate 300 may include a transparent substrate 310 supporting the color conversion material and the at least one reflection barrier rib 330 and a reflection layer 320 disposed between the transparent substrate 310 and the color conversion material and reflecting at least a portion of other light than the light of the first wavelength band.

The reflection layer 320 may be further disposed between the transparent substrate 310 and the at least one reflection barrier rib 330.

At least two transmissive areas TA may be positioned between two color conversion areas CA among the plurality of color conversion areas CA. In this case, each of the two transmissive areas TA may be surrounded by the at least one reflection barrier rib 330.

A display device 100 according to embodiments of the disclosure may comprise a substrate, a plurality of color conversion areas CA positioned on the substrate and having a color conversion material converting at least a portion of the light of the first wavelength band into light of a wavelength band other than the first wavelength band, a plurality of transmissive areas TA positioned in an area other than the plurality of color conversion areas CA, on the substrate, at least one reflection barrier rib 330 positioned on the substrate and separating the plurality of color conversion areas CA and the plurality of transmissive areas TA, and a color filter layer 112 including a plurality of color filters CF disposed to respectively correspond to the plurality of color conversion areas CA and the plurality of transmissive areas TA and at least one black matrix BM disposed to correspond to the at least one reflection barrier rib 330.

A color conversion plate 300 according to embodiments of the disclosure may comprise a transparent substrate 310, a plurality of first color conversion areas CA1 disposed on the transparent substrate 310 and having a first color conversion material 341 converting at least a portion of the light of the first wavelength band into light of a second wavelength band, and a plurality of second color conversion areas CA2 disposed on the transparent substrate 310 and having a second color conversion material 342 converting at least a portion of the light of the first wavelength band into light of a third wavelength band, and at least one reflection barrier rib 330 disposed to separate the plurality of first color conversion areas CA1 and the plurality of second color conversion areas CA2.

An upper surface of the at least one reflection barrier rib 330 may be positioned higher than an upper surface of the first color conversion material 341 and an upper surface of the second color conversion material 342. The upper surface of the first color conversion material 341 may be positioned between the upper surface of the second color conversion material 342 and the upper surface of the at least one reflection barrier rib 330.

The color conversion plate 300 may further comprise a plurality of transmissive areas TA disposed in an area other than the plurality of first color conversion areas CA1 and the plurality of second color conversion areas CA2 and surrounded by the at least one reflection barrier rib 330.

The color conversion plate 300 may further comprise a reflection layer 320 disposed on the transparent substrate 310 and disposed under the first color conversion material 341, the second color conversion material 342, and the at least one reflection barrier rib 330. As shown in FIG. 6, the reflection layer 320 is between the transparent substrate 310 and at least one of the first color conversion material 341, the second color conversion material 342, and the at least one reflection barrier rib 330.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure. Thus, the scope of the disclosure is not limited to the embodiments shown, but is to be accorded the widest scope consistent with the claims. The scope of protection of the disclosure should be construed based on the following claims, and all technical ideas within the scope of equivalents thereof should be construed as being included within the scope of the disclosure.

What is claimed is:

1. A display device, comprising:
    a display panel including a color filter layer;
    a backlight unit on the display panel, the backlight unit including a plurality of light sources configured to emit light of a first wavelength band; and
    a color conversion plate on a path along which the light emitted from the backlight unit is supplied to the display panel, wherein the color conversion plate includes:
        a plurality of color conversion areas each having a color conversion material configured to convert at least a portion of the light of the first wavelength band into light of a wavelength band that is different from the first wavelength band and transmit the converted light of the wavelength band that is different from the first wavelength band to the color filter layer;

a plurality of transmissive areas configured to transmit the light of the first wavelength band to the color filter layer; and at least one reflection barrier rib that separates the plurality of color conversion areas and the plurality of transmissive areas from each other, the at least one reflection barrier rib configured to reflect incident light, wherein the color filter layer includes a plurality of color filters and at least one black matrix disposed between the plurality of color filters, and wherein the at least one reflection barrier rib overlaps the at least one black matrix.

2. The display device of claim 1, wherein a thickness of the color conversion material is thinner than a thickness of the at least one reflection barrier rib.

3. The display device of claim 1, wherein a thickness of a first portion of the color conversion material that is in contact with the at least one reflection barrier rib is thicker than a thickness of a second portion of the color conversion material that is not in contact with the at least one reflection barrier rib.

4. The display device of claim 1, wherein a surface of the color conversion material is concave in a direction towards the backlight unit.

5. The display device of claim 1, wherein a surface of the at least one reflection barrier rib is attached to the display panel, and a surface of the color conversion material is spaced apart from the display panel.

6. The display device of claim 5, wherein an air layer is on the color conversion material such that the air layer is between the color conversion material and the display panel.

7. The display device of claim 1, wherein the plurality of color conversion areas include:

a plurality of first color conversion areas including a first color conversion material configured to convert at least a first portion of the light of the first wavelength band into light of a second wavelength band that is different from the first wavelength band; and a plurality of second color conversion areas including a second color conversion material, the second color conversion material configured to convert at least a second portion of the light of the first wavelength band into light of a third wavelength band that is different from the second wavelength band and the first wavelength band, and wherein a thickness of the first color conversion material is different from a thickness of the second color conversion material.

8. The display device of claim 7, wherein the second wavelength band is smaller than the third wavelength band, and the thickness of the first color conversion material is thicker than the thickness of the second color conversion material.

9. The display device of claim 1, wherein each of the plurality of color conversion areas and the plurality of transmissive areas overlaps a corresponding one of the plurality of color filters, and a width of each of the plurality of color conversion areas and the plurality of transmissive areas is greater than or equal to a width of each of the plurality of color filters.

10. The display device of claim 1, wherein a portion of each of the plurality of color conversion areas and a portion of each of the plurality of transmissive areas overlaps the at least one black matrix.

11. The display device of claim 1, wherein a width of the at least one reflection barrier rib is less than a width of the at least one black matrix.

12. The display device of claim 1, wherein the color conversion plate further comprises:

a transparent substrate, the color conversion material and the at least one reflection barrier rib on the transparent substrate; and a reflection layer between the transparent substrate and the color conversion material, the reflection layer configured to reflect at least a portion of light other than the light of the first wavelength band.

13. The display device of claim 12, wherein the reflection layer is between the transparent substrate and the at least one reflection barrier rib.

14. The display device of claim 1, wherein at least two transmissive areas from the plurality of transmissive areas are between two color conversion areas from the plurality of color conversion areas, and each of the two transmissive areas is surrounded by the at least one reflection barrier rib.

15. A display device, comprising:

a substrate;

a plurality of color conversion areas on the substrate, the plurality of color conversion areas including a color conversion material configured to convert at least a portion of light of a first wavelength band into light of a second wavelength band that is different from the first wavelength band;

a plurality of transmissive areas on the substrate such that the plurality of transmissive areas are non-overlapping with the plurality of color conversion areas;

at least one reflection barrier rib on the substrate, the at least one reflection barrier rib separating each of the plurality of color conversion areas and each of the plurality of transmissive areas from each other;

a color filter layer including a plurality of color filters, each of the plurality of color filters overlapping a corresponding one of the plurality of color conversion areas or a corresponding one of the plurality of transmissive areas; and at least one black matrix that overlaps the at least one reflection barrier rib.

16. A color conversion plate comprising:

a transparent substrate;

a plurality of first color conversion areas on the transparent substrate, the plurality of first color conversion areas including a first color conversion material configured to convert at least a first portion of light of a first wavelength band into light of a second wavelength band that is different from the first wavelength band;

a plurality of second color conversion areas on the transparent substrate, the plurality of second color conversion areas including a second color conversion material configured to convert at least a second portion of the light of the first wavelength band into light of a third wavelength band that is different from the second wavelength band and the first wavelength band; and at least one reflection barrier rib that separates each of the plurality of first color conversion areas and each of the plurality of second color conversion areas from each other, wherein an upper surface of the at least one reflection barrier rib has a height that is higher than a height of an upper surface of the first color conversion material and a height of an upper surface of the second color conversion material, and wherein the height of the upper surface of the first color conversion material is between the height of the upper surface of the second color conversion material and the height of the upper surface of the at least one reflection barrier rib.

17. The color conversion plate of claim 16, further comprising:
a plurality of transmissive areas that are non-overlapping with the plurality of first color conversion areas and the plurality of second color conversion areas and surrounded by the at least one reflection barrier rib.

18. The color conversion plate of claim 16, further comprising:
a reflection layer on the transparent substrate, the reflection layer between the transparent substrate and at least one of the first color conversion material, the second color conversion material, and the at least one reflection barrier rib.

* * * * *